United States Patent

Tonejc

[19]

[11] Patent Number: 6,049,043
[45] Date of Patent: Apr. 11, 2000

[54] PRINTED CIRCUIT BOARD

[75] Inventor: Vinko Tonejc, Berlin, Germany

[73] Assignee: Siemens Aktiengesellschaft, Munich, Germany

[21] Appl. No.: 09/031,027

[22] Filed: Feb. 26, 1998

[30] Foreign Application Priority Data

Feb. 26, 1997 [DE] Germany .......................... 197 07 709

[51] Int. Cl.⁷ .................................................. H05K 1/00
[52] U.S. Cl. ...................... 174/250; 174/260; 174/261; 439/77; 361/728; 361/805
[58] Field of Search .................... 174/250, 260, 174/261; 361/728, 813, 805, 819; 439/77, 80

[56] References Cited

U.S. PATENT DOCUMENTS

| | | | |
|---|---|---|---|
| 3,281,627 | 10/1966 | Fetterolf et al. ........................ | 174/261 |
| 3,335,327 | 8/1967 | Damon et al. .......................... | 361/767 |
| 5,625,169 | 4/1997 | Tanaka .................................. | 174/250 |
| 5,901,044 | 5/1999 | Marro .................................... | 361/278 |
| 5,920,463 | 7/1999 | Thomas et al. ........................ | 361/760 |
| 5,926,375 | 7/1999 | Watanabe et al. ..................... | 361/760 |

FOREIGN PATENT DOCUMENTS

| | | | |
|---|---|---|---|
| 572815 | 12/1993 | European Pat. Off. ............... | 174/261 |
| 237717 | 8/1962 | Germany . | |
| 27 35 124 A1 | 8/1977 | Germany . | |
| 29 11 761 B1 | 3/1979 | Germany . | |
| 30 01 234 A1 | 1/1980 | Germany . | |
| 89 12 914 U | 11/1989 | Germany . | |
| 43 23 87 C1 | 7/1993 | Germany . | |
| 44 37 954 C1 | 10/1994 | Germany . | |
| 2169751 | 7/1986 | United Kingdom ................... | 361/728 |
| 2279180 | 12/1994 | United Kingdom ................... | 439/77 |

*Primary Examiner*—Kristine Kincaid
*Assistant Examiner*—Dhiru R Patel
*Attorney, Agent, or Firm*—Hill & Simpson

[57] ABSTRACT

A printed circuit board has a plastic carrier plate and a one-piece pressed screen forming interconnects of the electrical circuit that are firmly mechanically connected to one another via preferably hot-stamped or ultrasound-deformed plastic webs. The interconnects have connector tabs bent off at a right angle and contact tabs for contacting the plug-in base and the relays to be accepted and also have stamped-out contact profiles for the connection to electrical components. The plugged-on relays and components are preferably connected to the interconnects welding. A two-sided access to parting locations in the pressed screen is made for tools on the basis of recesses in the carrier plate.

10 Claims, 4 Drawing Sheets

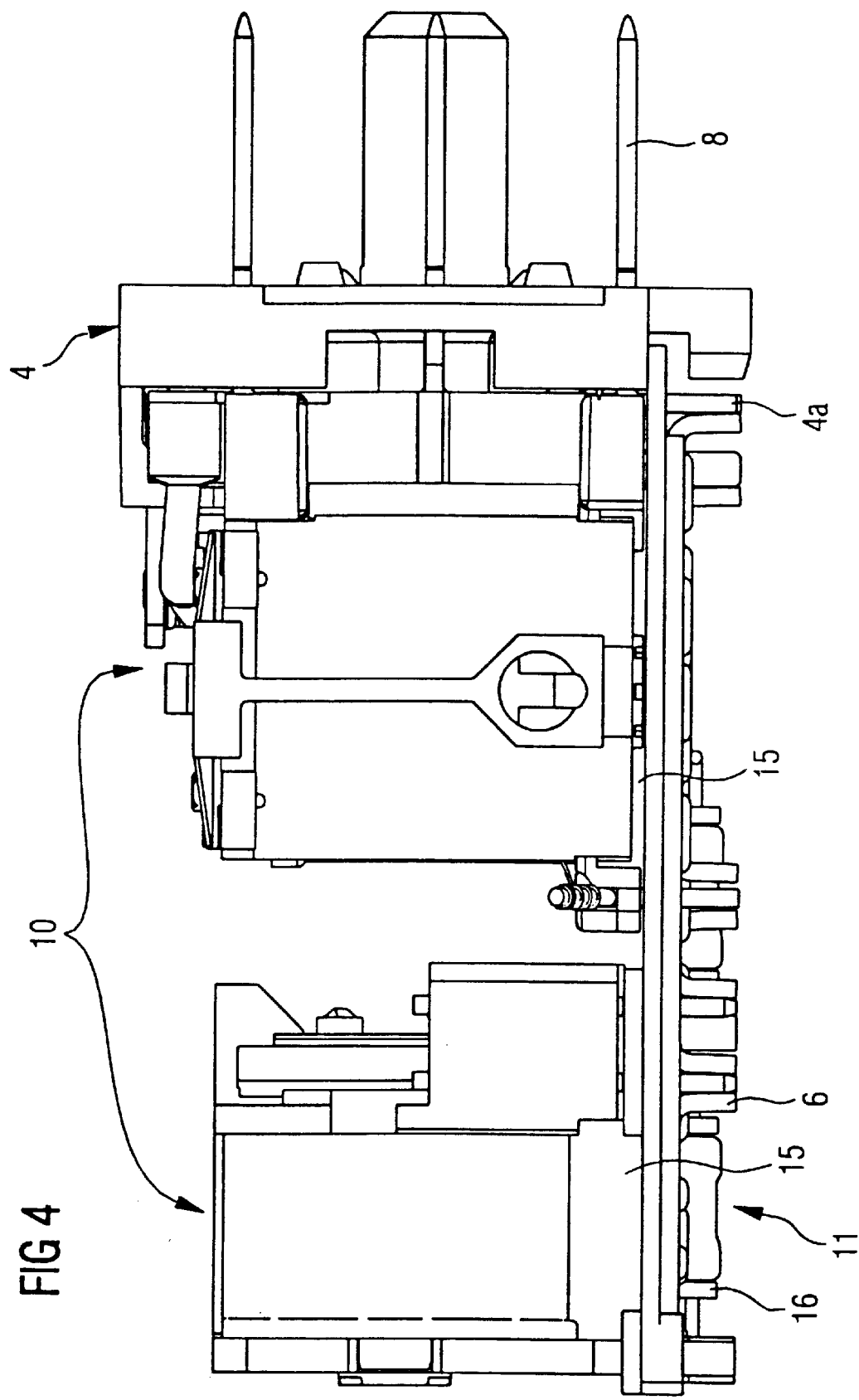

PRINTED CIRCUIT BOARD

BACKGROUND OF THE INVENTION

1. Field of the Invention

The present invention relates generally to the field of electronic devices, and more particularly, the present invention is directed to an improved printed circuit board and method of manufacturing the same.

2. Description of the Related Art

The present invention is directed to a printed circuit board for an electrical assembly, and is particularly useful for a relay module used in motor vehicles. The module is comprised of a carrier plate cast which is formed partly of plastic and interconnects connected thereto that are formed by at least one pressed screen. Electrical and electromechanical components such as relays plugged into the printed circuit board are electrically connected via the interconnects. The carrier plate comprises spacings that are located directly next to contact tabs which are bent out of the plane of the pressed screen for plug-in fastening of electrical components by insertion. The invention is also directed to a method for the manufacture of such a printed circuit board and to an arrangement of a printed circuit board on a plug-in base.

A pluggable assembly having a printed circuit board which is formed partly of plastic into which interconnects fashioned as pressed screens are embedded is disclosed by DE 43 23 827 C1. In this reference, components electrically connected via interconnects are secured on the printed circuit board. The components are inserted into through openings directly next to the contact tabs which are bent out of the plane of the pressed screen. The manufacturing method for the printed circuit board becomes complicated due to the fact that the production of the printed circuit board is performed by extrusion-coating of the pressed screen in a plurality of successive work steps, which is only economically feasible for large batches.

DE 27 35 124 A1 discloses a method for the manufacture of an electrical circuit as well as a circuit board in which the sheet metal blank corresponding to the circuit arrangement is first produced by punching from conductive material and this is subsequently molded into an insulating plastic compound. When molding the pressed screen into the plastic compound, recesses in the plastic compound are provided at both sides for separating the connecting webs. The connecting webs are separated following the molding of the pressed screen into the plastic compound. One shortcoming of this approach is that the leads of the electrical components must be soldered on. This is contrary to the desire for solder-free connections in electrical circuits with components containing contact surfaces. Furthermore, the manufacturing method is highly technical and requires that the necessary manufacturing tolerances for recesses and clearances be taken into consideration.

DE 89 12 914 U1 discloses a conductor arrangement of punched interconnects, whereby additional interconnects that realize complex circuit structures are applied onto the conductor carrier by a hot-coining process. The interconnects are thereby soldered to one another and to the components so that the structure of the coined interconnects is not damaged by welding. For accommodating at least two relays and customized wiring, the structuring of such a conductor arrangement requires many discrete parts and can therefore not be fabricated economically. Furthermore, this process cannot be performed in an automated fashion.

One goal of the present invention is to provide the automated manufacture of a printed circuit board for electrical circuits that is economical and which can be achieved with the simplest possible tools and additional equipment. For example, relays and a printed circuit board containing the customized interconnection can be accommodated in a housing under the condition of being able to operate the circuit with extremely high load currents.

SUMMARY OF THE INVENTION

According to the present invention, interconnects are arranged on one side of a carrier plate and are fixed by shaped plastic webs of the carrier plate. Connector tabs are bent out of the pressed screen plane in an end region of the carrier plate for contacting the connecting leads of a plug-in base.

Advantageously, the positional arrangement of the interconnects relative to the carrier plate is specifically defined by the plastic webs, whereby the customized circuit diagram is suitably disentangled to such an extent that a minimum number of pressed screens are needed in order to form the interconnects.

In an advantageous development, oblong plastic webs, which are desirably provided with rounded edges, are fashioned for further fixing the carrier plate and pressed screen in the longitudinal and transverse directions. In the region of the separation locations of the pressed screen, the carrier plate can comprise recesses for separating tools, particularly for punch tools, in order to advantageously enable both-sided accesses to the separation location for these. As a result thereof, the connecting webs left in the pressed screen for mechanical stabilization in the manufacturing process can be removed easily. Additionally, detents fashioned in both the longitudinal and transverse directions as well as guide elements for the interconnects, which are preferably formed by a single-part pressed screen, can be integrated into the carrier plate in order to thus enable a simple and low-tolerance arrangement of carrier plate and interconnects relative to one another. Specifically, a combination of detent and guide element is thereby meaningful as further development, whereby the guide element is integrated into the detent in the form of a guide nose.

Further, the interconnects can be formed into channels of the plastic carrier plate and can be secured by shaped edge regions of the channels. This represents a possible alternative embodiment of the inventive printed circuit board, whereby both the plastic webs for fastening as well as the detents and guide elements for alignment of the interconnects can be eliminated since these features are functionally combined by the channels, including the deformed edge regions. By filling up the spaces between neighboring interconnects, the channels provide for the insulation thereof.

Seating surfaces of the carrier plate specifically adapted to the shape of the plugged on components, moreover, improves connection of the components, particularly of the heavier relays, on the printed circuit board. Alternatively, specific holders into which the corresponding components are simply inserted are provided in the carrier plate for components that present no manipulation problems during assembly with respect to their weight. The terminal elements of these components are secured to pronounced contact profiles of the interconnects, preferably by resistance welding. Desirably, the plug connections of the other components can likewise be welded to the contact tabs of the printed circuit board for increasing the mechanical strength and for improving the electrical conductivity.

In the method for manufacturing the inventive printed circuit board, the carrier plate having these features is first cast as a formed part made of plastic. The interconnects are cut out of the conductor sheet metal in the form of a one-piece pressed screen, preferably at the same time, whereby connecting webs are left in the region of separating locations in the pressed screen for improving manipulation and mechanical strength. The joining of the carrier plate and pressed screen takes place in the next manufacturing step. The pressed screen is thereby simply laid onto the carrier plate. The pressed screed is then pushed against the detents fashioned in the carrier plate, first in the transverse, and then in the longitudinal direction. Guide elements of the carrier plate can assist in the alignment procedure in that they fix the arrangement in at least one direction. Aligned in the ultimate manner, the pressed screen and carrier plate are firmly joined to one another by deforming the plastic webs or the channel edge regions, preferably with hot die stamping or ultrasound shaping. The connecting webs are removed, preferably, by a punch cut via the recesses of the carrier plate in the region of the parting locations of the pressed screen. This provides the final circuit topology. Thereafter, the components have their terminal elements plugged into the printed circuit board that has been produced and are contacted to the interconnects, preferably by welding.

The method for manufacturing the disclosed printed circuit board is advantageous specifically in the production of low numbers of printed circuit boards since the manufacturing process can be implemented in little time and with low auxiliary means and tool outlay compared to the molding of interconnects or sheet metal blanks in plastic of prior methods. Moreover, the desire for solder-free electrical connections in electrical circuits with switch contacts is advantageously taken into account in this manufacturing method.

Given the arrangement of the inventive printed circuit board on a plug-in base, the printed circuit board is arranged perpendicular to the principal plane of the plug-in base in the edge region thereof. The overall arrangement is secured by the connection of the connector tabs of the plug-in base with those of the printed circuit board. Large components such as relays are attached to the side of the printed circuit board facing toward the plug-in base. Thus, for example, a cap can still be inverted over the printed circuit board, this cap forming a housing together with the base. In an advantageous embodiment of this arrangement, the load terminals of the components, particularly of the relays, are directly contacted via the plug-in base, whereas the control terminals are connected to the printed circuit board.

BRIEF DESCRIPTION OF THE DRAWINGS

The present invention is explained in greater detail below on the basis of exemplary embodiments with reference to the drawings wherein:

FIG. 4 is the side view of the printed circuit board shown in FIG. 1.

DETAILED DESCRIPTION OF THE PREFERRED EMBODIMENTS

Figure 1:
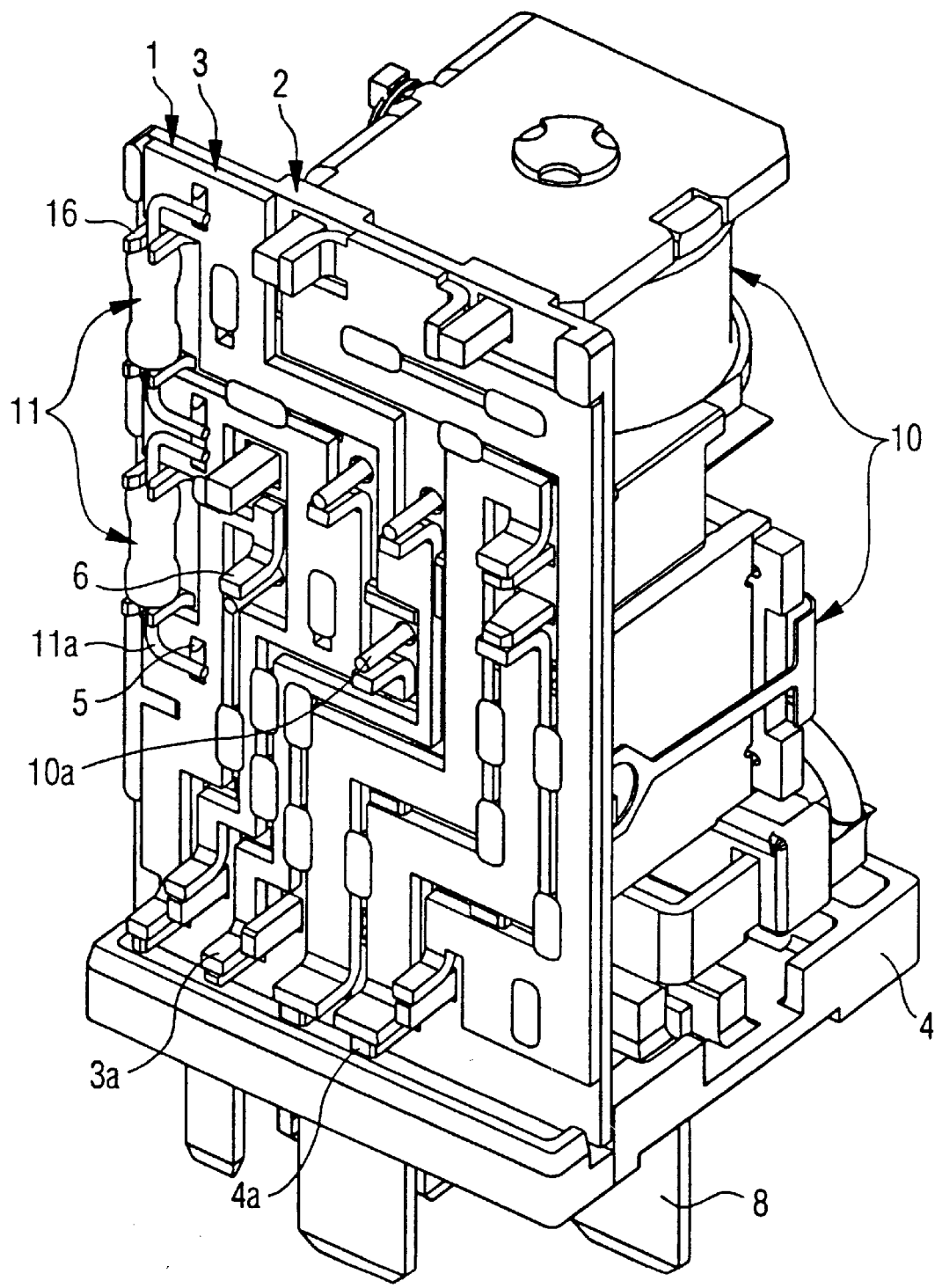
FIG. 1 is a perspective view of a printed circuit board according to the present invention.
Figure 2:
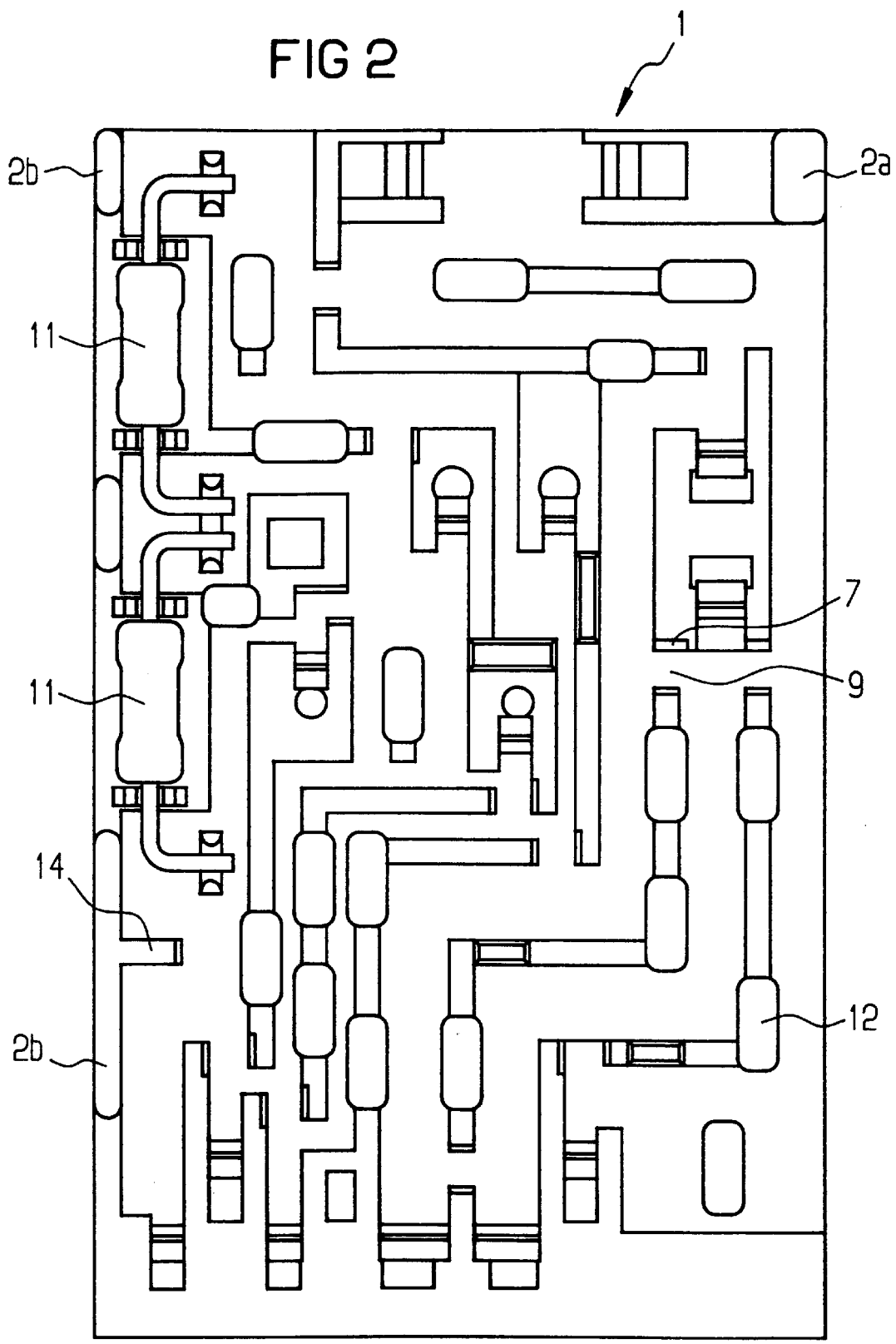
FIG. 2 illustrates the printed circuit board shown in FIG. 1 in a plan view.
Figure 3:
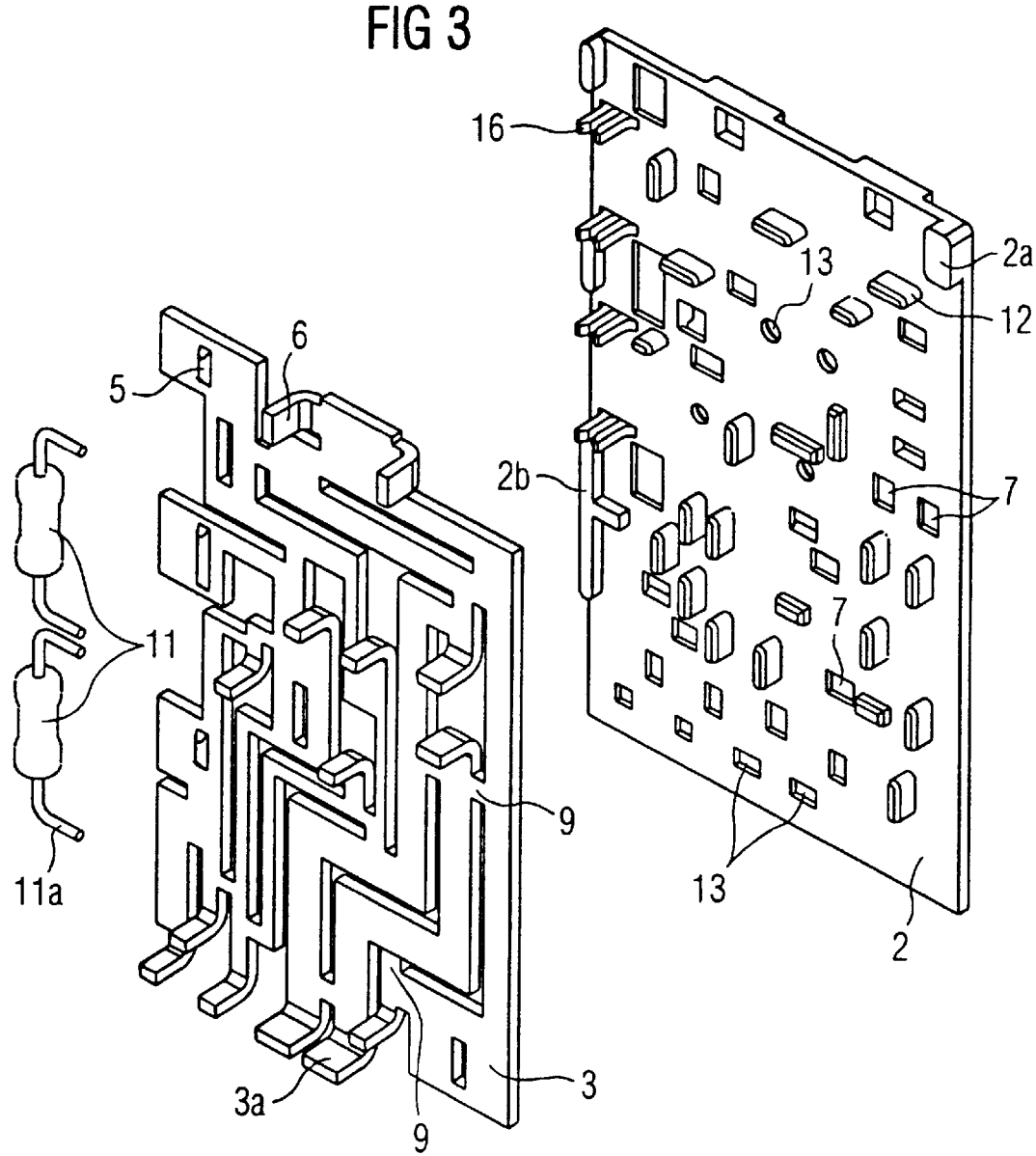
FIG. 3 illustrates the component parts of the printed circuit board before the deformation of the plastic webs and the welding of the electrical component parts.

The printed circuit board 1 shown in FIGS. 1 and 2, which is composed of a plastic carrier plate 2 and interconnects arranged in one plane, is equipped with two relays 10 as well as two electrical component parts 11. The shaped plastic webs 12 project from the carrier plate 2. Some extend in a longitudinal direction and others extend in a transverse direction. They cooperate to secure all-sides of the interconnects formed by a pressed screen 3 on the carrier plate 2. In order to enable both-sided access to the separating locations 9 in the pressed screen 3 for punch tools, recesses 7 are provided in the region opposite on the carrier plate (see FIG. 2 and FIG. 3). Detents 2a, 2b are fashioned in longitudinal and transverse direction for simple and fast alignment of carrier plate 2 and pressed screen 3. Further, an additional guide element 14 in the form of a guide nose is integrated in a detent 2b. This further secures the pressed screen 3 on the carrier plate 2 in longitudinal direction of the printed circuit board 1 (FIG. 2).

Seating surfaces 15 for relays 10 are also formed in the carrier plate 2 in order to improve their mounting on the printed circuit board 1 (FIG. 4). Components 11 having low weight are merely inserted into corresponding holders 16 of the carrier plate 2, and their terminal elements 11a are welded to the interconnects at contact profiles 5 specifically provided therefor that are embossed from the back side. Thus, an adequate resistance to being pulled off is established (see FIG. 1 and FIG. 3). Clearances 13 that are located immediately next to the contact tabs 6 bent out of the pressed screen 3 at a right angle are provided in the carrier plate 2 for the acceptance of the terminal elements 10a of the relays 10. The contact tabs 6 are welded to the terminal elements 10a and thereby serve for contacting the relays 10 to the interconnects (FIG. 1).

The manufacture of the printed circuit board 1 can be embodied in few steps and with simple tools. After producing the carrier plate 2 by mold casting of plastic and the pressed screen 3 by sheet metal tailoring from the conductor material, the pressed screen 3 is laid onto the side surface of the carrier plate 2. Subsequently, the pressed screen 3 is pushed in the transverse direction up against the detents 2b of the carrier plate 2. This is followed by alignment in the longitudinal direction, which is defined by the detents 2a. The arrangement is fixed in the longitudinal direction by a guide element 14 that is integrated in a detent 2b. In addition, plastic webs 12 fashioned in the longitudinal and transverse direction prevent the dislocation of the pressed screen 3 on the carrier plate 2. After the plastic webs 12 have been deformed by hot stamping or ultrasound deformation, the printed circuit board 1 is a fixed single unit of the carrier plate 2 and pressed screen 3. In the last manufacturing step, the connecting webs left in the one-piece pressed screen 3 are removed at the parting locations 9 by a punch cut, so that the ultimate circuit topology arises.

FIG. 1 and FIG. 4 each illustrates an arrangement of an equipped printed circuit board 1 on a plug-in base 4 residing at an underside perpendicular thereto. Flat plugs 8 emerging at a right angle are attached to the underside of the plug-in base 4. The contacting of the printed circuit board 1 with the plug-in base 4 takes place via respectively allocated connector tabs 3a and 4a. As can be seen in FIG. 4, the connector tabs 4a of the base 4 are conducted through corresponding clearances 18 in the carrier plate 2 that are located directly next to the connector tabs 3a of the printed circuit board 1. The desired electrical conductivity as well as the required mechanical strength of the connection between printed circuit board 1 and plug-in base 4 is established by the welding of the connector tabs 3a and 4a. A housing (not explicitly shown here) that encloses the assemblies is added thereto in the ultimate configuration.

The illustrated configuration of the printed circuit board is exemplary, only, as the disclosed embodiment may be modified. Although conductors manufactured according to the stamping process, which enable the accommodation of the individual interconnects in a one-piece pressed screen given suitable disentanglement of the circuit topology, are less suitable for the realization of complex circuits, they continue to be advantageous in circuits with which higher electrical powers are controlled, especially since they enable adaptation to the respective area of employment on the basis of possibly selecting conductor material and strength.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim as my invention:

1. A printed circuit board for an electrical assembly, comprising:

a carrier plate formed partly of plastic and having interconnects connected thereto formed by at least one pressed screen, at least one electromechanical component plugged into the printed circuit board electrically connected to the interconnects;

the carrier plate comprising openings located adjacent to contact tabs bent out of a plane of said at least one pressed screen wherein the interconnects at a side of the carrier plate are formed of deformed plastic webs of the carrier plate and connector tabs bent out of said at least one pressed screen plane in an end region of the carrier plate to contact a base.

2. A printed circuit board according to claim 1, wherein the carrier plate comprises recesses for separating tools at separating locations of said at least one pressed screen.

3. A printed circuit board according to claim 1 or 2, wherein detents are formed in a longitudinal and transverse direction of the carrier plate and guide elements are integrated in the detents for alignment of the interconnects.

4. A printed circuit board according to claim 1 or 2, wherein said at least one pressed screen forming the interconnects are arranged in channels of the carrier plate and are fixed by deformed edge regions of the channels.

5. A printed circuit board according to claim 1 or 2, wherein the carrier plate has means for receiving electrical components.

6. A printed circuit board according to claim 1 or 2, wherein contact profiles on the interconnects are formed for fastening terminal elements of the component.

7. A printed circuit board according to claim 1 or 2, wherein oblong plastic webs formed on the carrier plate fix the interconnects in longitudinal and transverse directions.

8. A printed circuit board according to claim 1 or 2, wherein connections from the component to the interconnects are solder-free connections.

9. A printed circuit board according to claim 1, wherein the printed circuit board is perpendicular to a principal plane of the base in an edge region and is secured by connection of connector tabs of the printed circuit board to the connecting conductors of the base, and at least one relay and other electrical components are located at a side of the printed circuit board facing toward the base.

10. A printed circuit board according to claim 9, wherein the other electrical components are contacted with control terminals via the printed circuit board and are contacted with load terminals via the base.

* * * * *